United States Patent
Jang et al.

(10) Patent No.: US 9,941,951 B2
(45) Date of Patent: Apr. 10, 2018

(54) INTERFERENCE CANCELLATION RELAY DEVICE

(71) Applicant: SOLiD, INC., Seongnam-si, Gyeonggi-do (KR)

(72) Inventors: Inho Jang, Yongin-si (KR); Hyunchae Kim, Seoul (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/117,926

(22) PCT Filed: Jul. 2, 2014

(86) PCT No.: PCT/KR2014/005900
§ 371 (c)(1),
(2) Date: Aug. 10, 2016

(87) PCT Pub. No.: WO2015/152465
PCT Pub. Date: Oct. 8, 2015

(65) Prior Publication Data
US 2017/0012696 A1 Jan. 12, 2017

(30) Foreign Application Priority Data

Mar. 29, 2014 (KR) ........................ 10-2014-0037347

(51) Int. Cl.
*H04B 7/14* (2006.01)
*H04B 7/155* (2006.01)
(Continued)

(52) U.S. Cl.
CPC ....... *H04B 7/15585* (2013.01); *H03F 1/3247* (2013.01); *H03F 3/19* (2013.01);
(Continued)

(58) Field of Classification Search
CPC ............ H04B 7/15585; H04B 7/15578; H04B 17/318; H03F 3/21; H03F 1/3247; H03F 3/19; H04L 5/0048
See application file for complete search history.

(56) References Cited

U.S. PATENT DOCUMENTS

2008/0125033 A1* 5/2008 Lee .................... H04B 7/15585
455/22
2008/0225758 A1* 9/2008 Proctor .............. H04B 7/15542
370/279
(Continued)

FOREIGN PATENT DOCUMENTS

KR 10-2007-0092156 A 9/2007
KR 10-2007-0113887 A 11/2007
(Continued)

OTHER PUBLICATIONS

International Search Report for PCT/KR2014/005900 dated Dec. 16, 2014.

*Primary Examiner* — Clemence S Han
(74) *Attorney, Agent, or Firm* — Sughrue Mion, PLLC

(57) ABSTRACT

Provided is an interference cancellation relay device. The interference cancellation relay device includes: an interference cancellation unit cancelling an interference signal from an input signal and outputting the input signal from which the interference signal is removed; a gain control unit controlling a gain of an output signal of the interference cancellation unit; and a pre-distortion unit distorting the output signal of the interference cancellation unit, of which the gain is controlled by the gain control unit.

5 Claims, 7 Drawing Sheets

(51) Int. Cl.
  *H04B 17/318* (2015.01)
  *H03F 1/32* (2006.01)
  *H03F 3/19* (2006.01)
  *H03F 3/21* (2006.01)
  *H04L 5/00* (2006.01)

(52) U.S. Cl.
  CPC ........... *H03F 3/21* (2013.01); *H04B 7/15578* (2013.01); *H04B 17/318* (2015.01); *H04L 5/0048* (2013.01)

(56) References Cited

U.S. PATENT DOCUMENTS

| | | | |
|---|---|---|---|
| 2009/0207776 A1 | 8/2009 | Baik et al. | |
| 2009/0290516 A1* | 11/2009 | Han | H03G 3/3068 370/277 |
| 2010/0109771 A1* | 5/2010 | Baik | H04B 7/15585 330/149 |
| 2010/0118922 A1* | 5/2010 | Ahn | H04B 7/15585 375/214 |
| 2010/0194987 A1* | 8/2010 | Kim | H04B 7/15585 348/575 |
| 2010/0284447 A1* | 11/2010 | Gore | H04B 7/15585 375/211 |
| 2010/0285738 A1* | 11/2010 | Howard | H04B 7/15535 455/9 |
| 2010/0285744 A1* | 11/2010 | Wang | H04B 7/15578 455/24 |
| 2011/0116392 A1* | 5/2011 | Barriac | H04B 7/15585 370/252 |
| 2011/0116531 A1* | 5/2011 | Gore | H04B 7/15585 375/213 |
| 2011/0143655 A1* | 6/2011 | Ahn | H04B 7/15542 455/9 |
| 2011/0170473 A1* | 7/2011 | Proctor, Jr. | H04B 7/15585 370/315 |
| 2011/0195657 A1* | 8/2011 | Takeda | H04B 7/15585 455/7 |
| 2011/0223853 A1* | 9/2011 | Wang | H04B 7/15585 455/7 |
| 2011/0269395 A1* | 11/2011 | Larsson | H04B 7/0617 455/7 |
| 2012/0002586 A1* | 1/2012 | Gainey | H04B 1/525 370/315 |
| 2012/0115412 A1* | 5/2012 | Gainey | H04B 3/23 455/7 |
| 2012/0287968 A1* | 11/2012 | Gainey | H04B 7/15585 375/211 |
| 2012/0314646 A1* | 12/2012 | Wang | H04B 7/15585 370/315 |
| 2013/0034128 A1* | 2/2013 | Gore | H04B 7/15585 375/211 |
| 2013/0077502 A1* | 3/2013 | Gainey | H04B 7/15578 370/252 |
| 2013/0077556 A1* | 3/2013 | Gore | H04B 7/15578 370/315 |
| 2013/0078907 A1* | 3/2013 | Gore | H04B 7/15535 455/11.1 |
| 2013/0122802 A1* | 5/2013 | Wang | H04B 7/15578 455/9 |
| 2013/0142222 A1* | 6/2013 | Wang | H04B 7/15578 375/211 |
| 2013/0143483 A1* | 6/2013 | Gore | H04B 7/15585 455/7 |
| 2013/0273834 A1* | 10/2013 | Sundstrom | H04B 7/155 455/7 |
| 2014/0050253 A1* | 2/2014 | Jovanovic | H04L 27/26 375/211 |

FOREIGN PATENT DOCUMENTS

| | | |
|---|---|---|
| KR | 10-2008-0078510 A | 8/2008 |
| KR | 10-2009-0111031 A | 10/2009 |
| KR | 10-2009-0122041 A | 11/2009 |

\* cited by examiner

INTERFERENCE CANCELLATION RELAY DEVICE

CROSS REFERENCE TO RELATED APPLICATIONS

This application is a National Stage of International Application No. PCT/KR2014/005900, filed Jul. 2, 2014, and claims priority from Korean Patent Applications No. 10-2014-0037347 filed Mar. 29, 2014, the contents of which are incorporated herein by reference in their entireties.

BACKGROUND

1. Field

The inventive concept relates to an interference cancellation relay device, and particularly, to an interference cancellation relay device having a pre-distortion function.

2. Description of Related Art

In general, a relay device is used for transmitting a signal between a base station and a terminal and extension of a service or improvement of a service quality in a radio signal shadow area. A wireless relay device may be provided as one example of the relay device, and the wireless relay device provides a communication service for receiving the signal transmitted from the base station or the terminal through a receiving antenna, amplifying the received signal, and transmitting the amplified signal to the terminal or the base station through a transmitting antenna.

In the case of the wireless relay device, a degree of isolation at a predetermined level or higher is required between the receiving antenna and the transmitting antenna in order to prevent deterioration in quality of the communication service. In recent years, as it has been difficult to secure the degree of isolation due to a spatial limitation according to a miniaturization demand trend of the wireless relay device, a research into an interference cancellation relay device has been actively conducted, which can secure the degree of isolation while overcoming the spatial limitation by applying an interference cancellation function to cancel feed-back signals, that is, signals input into the receiving antenna as interference signals through a variety of paths, after the signals are radiated from the transmitting antenna.

In addition, the radio relay device has a power amplifier at a transmitting end to transmit a signal having sufficient power to the terminal or the base station and the deterioration in quality of the communication service is caused due to a non-linear characteristic of the power amplifier. For preventing the quality deterioration, an attempt for implementing a pre-distortion function for improving the non-linear characteristic of the power amplifier in the wireless relay device has been continued and in particular, an attempt for implementing the pre-distortion function even in the interference cancellation relay device has been actively made.

However, in the case of the interference cancellation relay device, since the received signal significantly fluctuates due to the interference signals, it is difficult to implement the pre-distortion function therein.

SUMMARY

The inventive concept directs to an interference cancellation relay device in which a pre-distortion function can be stably implemented.

According to an aspect of the inventive concept, there is provided an interference cancellation relay device, comprising: an interference cancellation unit cancelling an interference signal from an input signal and outputting the input signal from which the interference signal is cancelled; a gain control unit controlling a gain of an output signal of the interference cancellation unit; and a pre-distortion unit distorting the output signal of the interference cancellation unit, of which the gain is controlled by the gain control unit.

According to an exemplary embodiment, wherein the gain control unit may include, a measurement unit detecting a reference signal from the output signal of the interference cancellation unit and measuring an intensity of the reference signal; and a control unit controlling the gain of the output signal of the interference cancellation unit by using the intensity of the reference signal.

According to an exemplary embodiment, wherein the reference signal may be a signal having a predetermined intensity regardless of fluctuation of a data amount included in the input signal.

According to an exemplary embodiment, wherein the measurement unit may include, a detection unit detecting the reference signal from the output signal of the interference cancellation unit; and a calculation unit calculating the intensity of the reference signal.

According to an exemplary embodiment, wherein the control unit may include, a comparison unit comparing the intensity of the reference signal with a predetermined reference intensity; and a control unit controlling the gain of the output signal of the interference cancellation unit according to a result of comparing the intensity of the reference signal and the reference intensity.

According to another aspect of the inventive concept, there is provided an interference cancellation relay device, comprising: a first gain control unit controlling a gain of an input signal; a conversion unit digitalizing the input signal of which the gain is controlled by the first gain control unit; an interference cancellation unit cancelling an interference signal from the digitalized input signal and outputting the input signal from which the interference signal is cancelled; a second gain control unit controlling the gain of the output signal of the interference cancellation unit; and a pre-distortion unit distorting the output signal of the interference cancellation unit, of which the gain is controlled by the second gain control unit.

According to an exemplary embodiment, wherein the second gain control unit may include, a measurement unit detecting a reference signal from the output signal of the interference cancellation unit and measuring an intensity of the reference signal; and a first control unit controlling the gain of the output signal of the interference cancellation unit by using the intensity of the reference signal.

According to an exemplary embodiment, wherein the reference signal may be a signal having a predetermined intensity regardless of fluctuation of a data amount included in the input signal.

According to an exemplary embodiment, wherein the first gain control unit may control the gain of the input signal by using the intensity of the reference signal, which is measured by the measurement unit.

According to an aspect of the inventive concept, an interference cancellation relay device includes a gain control unit constantly controlling an output signal of an interference cancellation unit and providing the output signal to a pre-distortion unit, and as a result, the interference of signals and the oscillation can be minimized and the pre-distortion unit can stably improve a non-linear characteristic of a power amplifier, thereby improving the quality of a communication service.

BRIEF DESCRIPTION OF THE FIGURES

A brief description of each drawing is provided to more sufficiently understand drawings used in the detailed description of the inventive concept.

DETAILED DESCRIPTION OF EXEMPLARY EMBODIMENTS

Figure 1:
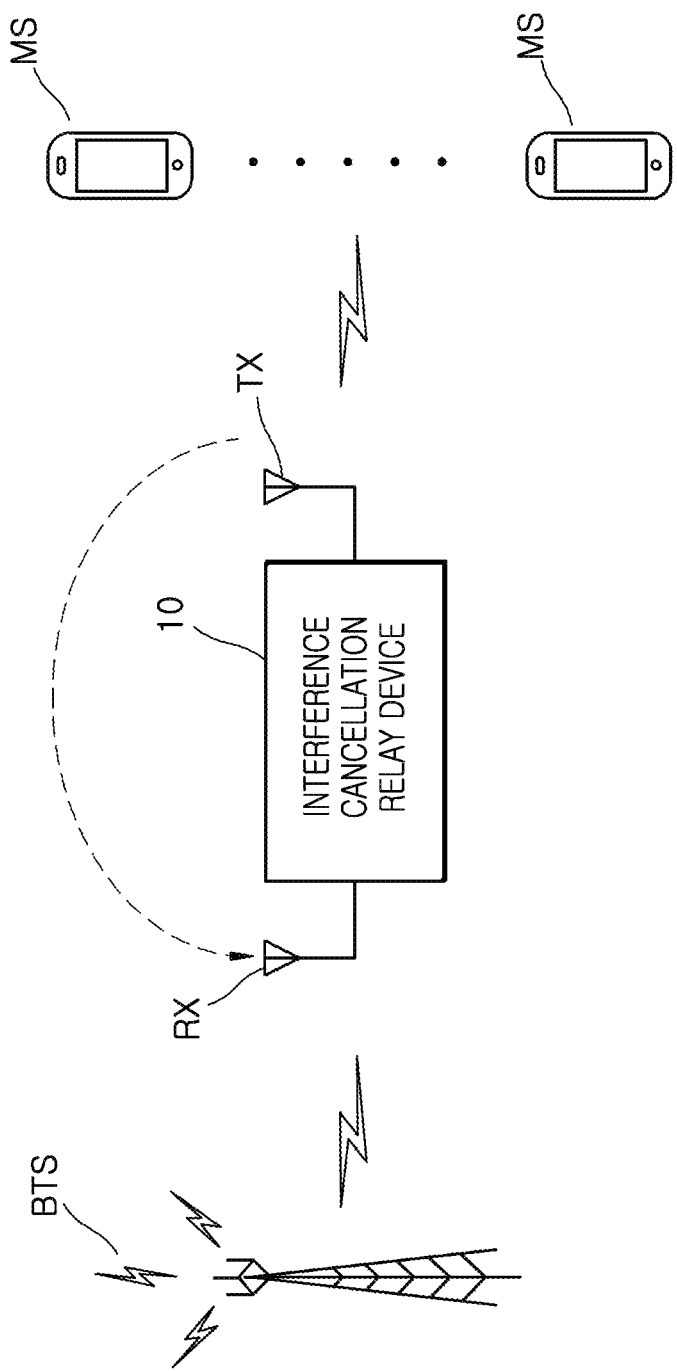
FIG. 1 is a diagram for describing a relay environment of an interference cancellation relay device according to an embodiment of the inventive concept.

The inventive concept may be variously modified and have various embodiments, so that specific embodiments will be illustrated in the drawings and described in the detailed description. However, this does not limit the inventive concept to specific embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification just are identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

Further, terms including "unit", "er", "member", "module", and the like disclosed in the specification mean a unit that processes at least one function or operation and this may be implemented by hardware or software or a combination of hardware and software.

In addition, it will be apparent that in the specification, components are just classified for each main function which each component takes charge of. That is, two or more components to be described below may be provided to be combined into one component or one component may be provided to be separated into two or more for each of more subdivided functions. In addition, each of the components to be described below may additionally perform some or all functions among functions which other components take charge of in addition to the main function which each component takes charge of and some functions among the main functions which the respective take charge of may be exclusively charged and performed by other components.

Hereinafter, embodiments of the inventive concept will be sequentially described in detail.

FIG. 1 is a diagram for describing a relay environment of an interference cancellation relay device 10 according to an embodiment of the inventive concept. In FIG. 1, a donor antenna transceiving a signal with a base station BTS is illustrated as a receiving antenna RX and a service antenna transceiving the signal with a terminal MS is illustrated as a transmitting antenna TX, for convenience of the explanation. In addition, in FIG. 1, it is illustrated that the interference cancellation relay device 10 includes one receiving antenna RX and one transmitting antenna TX, but is not limited thereto and interference cancellation relay device 10 may include at least two receiving antennas RX and at least two transmitting antennas TX.

Referring to FIG. 1, the interference cancellation relay device 10 may amplify a downlink signal of the base station BTS received through the receiving antenna RX and transmit the amplified downlink signal to the terminal MS through the transmitting antenna TX.

In this case, signals radiated through the transmitting antenna TX are input into the receiving antenna RX through wireless environment to form interference signals. As a result, while the downlink signal of the base station BTS, which is an original signal input into the receiving antenna RX and the interference signals are aggregated to be amplified, the interference cancellation relay device 10 may be oscillated. In order to solve the oscillation problem, the interference cancellation relay device 10 includes an interference cancellation unit 300 (see FIG. 2 or 5) that may cancel interference signals caused by the signal radiated from the transmitting antenna TX from the downlink signal of the base station BTS.

In addition, when the interference cancellation relay device 10 amplifies the downlink signal of the base station BTS through the power amplifier (not illustrated) and transmits the amplified downlink signal, the downlink signal of the base station BTS is distorted due to the non-linear characteristic of the power amplifier, and as a result, the quality of a communication service may deteriorate. In order to solve the quality deterioration, the interference cancellation relay device 10 includes a pre-distortion unit 500 (see FIG. 2 or 5) that pre-distorts an input signal into the amplifier based on the non-linear characteristic of the power amplifier, which is measured by detecting an output signal of the power amplifier.

As a general interference cancellation relay device receives the downlink signal of the base station through wirelessly, that is, through the receiving antenna as described above, the general interference cancellation relay device is influenced by the interference signals, and as a result, an input signal into the interference cancellation relay device is rapidly changed. Thus, in the general interference cancellation relay device, it is difficult to stably perform the pre-distortion function and it is difficult to secure quality reliability of the communication service.

On the contrary, the interference cancellation relay device 10 according to the inventive concept includes a gain control unit 400 (see FIG. 2 or 5) that constantly maintains an output signal gain of the interference cancellation unit to allow the pre-distortion unit to stably operate, thereby securing the reliability of the communication service. Hereinafter, this will be described in detail with reference to FIG. 2, and the like.

Meanwhile, the interference cancellation relay device 10 may amplify an uplink signal of the terminal MS, which is received through the transmitting antenna TX and transmit the amplified uplink signal to the base station BTS through the receiving antenna RX. Although not illustrated in FIG. 1, even in this case, signals radiated through the receiving antenna RX are input into the transmitting antenna TX through the wireless environment to form the interference signal, and as a result, as the uplink signal of the terminal MS, which is an original signal input into the transmitting antenna TX and the interference signal are aggregated and amplified, the interference cancellation relay device 10 may be oscillated. Although not illustrated in FIG. 1, the interference cancellation relay device 10 may further include an interference cancellation unit, a gain control unit, and a pre-distortion unit in an uplink similarly to the interference cancellation unit, the gain control unit, and the pre-distortion unit in the downlink. In this case, components which correspond to each other in the downlink and the uplink of the interference cancellation relay device 10 may be implemented as one or implemented separately. For example, the gain control unit in the downlink and the gain control unit in the uplink of the interference cancellation relay device 10 may be implemented as one component or implemented as respective distinguished components.

Figure 2:
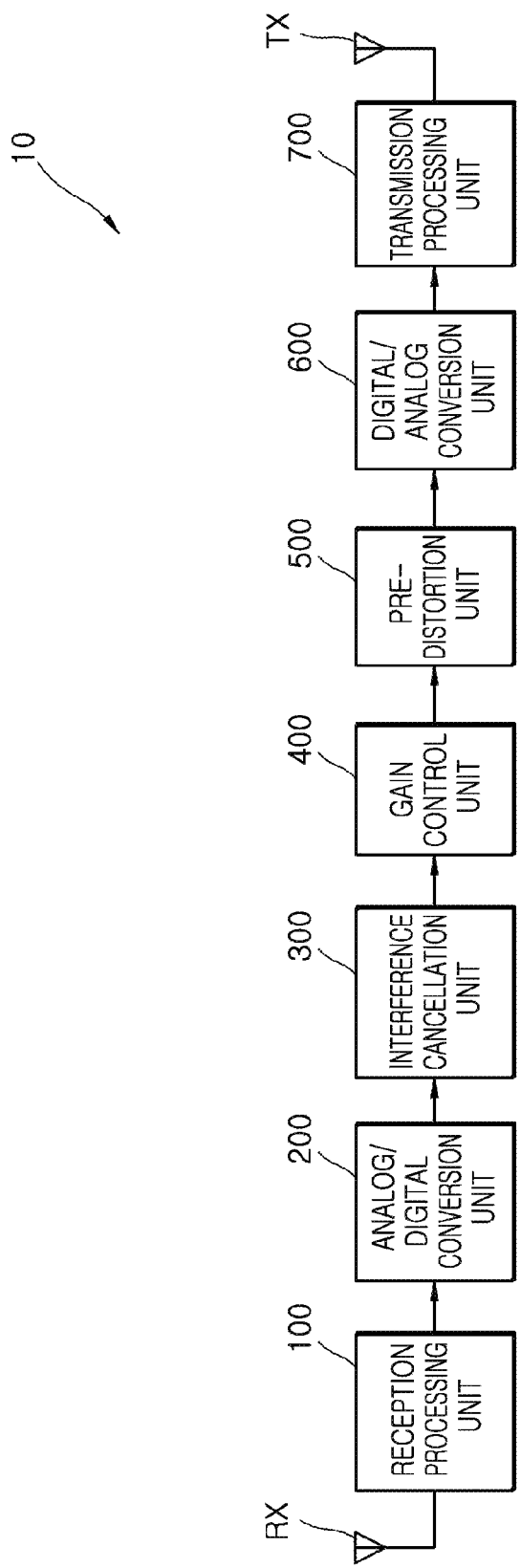
FIG. 2 is a block diagram schematically illustrating an interference cancellation relay device according to an embodiment of the inventive concept.

FIG. 2 is a block diagram schematically illustrating an interference cancellation relay device 10 according to an embodiment of the inventive concept. In FIG. 2, only components for transmitting the downlink signal of the base station BTS (see FIG. 1) to the terminal MS (see FIG. 1) in the interference cancellation relay device 10 are illustrated for convenience of the explanation. Since components for transmitting the uplink signal of the terminal MS (see FIG. 1) to the base station BTS (see FIG. 1) may correspond to the components for transmitting the downlink signal, hereinafter, detailed description of the components for transmitting the uplink signal will be omitted. Further, a reception processing unit 100 and an analog/digital conversion unit 200 and a digital/analog conversion unit 600 and a transmission processing unit 700 are illustrated as respective separate components for convenience of the explanation in FIG. 2.

Referring to FIG. 2, the interference cancellation relay device 10 may include the receiving antenna RX, the reception processing unit 100, the analog/digital conversion unit 200, the interference cancellation unit 300, the gain control unit 400, the pre-distortion unit 500, the digital/analog conversion unit 600, the transmission processing unit 700, and the receiving antenna TX.

The reception processing unit 100 may receive an input signal provided to the interference cancellation relay device 10 from the base station BTS (see FIG. 1) through the receiving antenna RX. The input signal may include at least one of the downlink signal of the base station BTS (see FIG. 1) and the interference signal based on the signal radiated through the transmitting antenna TX.

The reception processing unit 100 may be configured to eliminate noise from the input signal and frequency-down-convert the input signal and output the input signal which is frequency-down-converted. For example, the reception processing unit 100 may include a filter for selecting a required band in the input signal, a low noise amplifier amplifying the input signal by minimizing the noise in the input signal, and a frequency down converter converting the input signal amplified by the low noise amplifier into a signal in an intermediate frequency band from a signal in a radio frequency (RF) band, and perform signal processing for converting the input signal into a digital signal by the analog/digital conversion unit 200 through the above-described components. Herein, the frequency down converter may be optionally omitted.

The reception processing unit 100 may further include a filter for eliminating an image frequency from the input signal between the low noise amplifier and the frequency down converter. Further, the reception processing unit 100 may further include the amplifier for amplifying the input signal converted into the signal in the intermediate frequency band, another frequency down converter for converting the amplified input signal in the intermediate frequency band into a signal in a baseband, and the like.

The analog/digital conversion unit 200 may receive the input signal signal-processed by the reception processing unit 100. The analog/digital conversion unit 200 may convert the input signal signal-processed by the reception processing unit 100 into the digital signal.

The interference cancellation unit 300 may receive the input signal digitalized from the analog/digital conversion unit 200. The interference cancellation unit 300 may cancel the interference signal from the digitalized input signal and output the digitalized input signal from which the interference signal is cancelled. For example, the interference cancellation unit 300 may model an estimation interference signal corresponding to the interference signal based on the digitalized input signal input into the interference cancellation unit 300 or the output signal of the interference cancellation unit 300, which is fed back, and cancel the interference signal from the digitalized input by using the modeled estimation interference signal and output the downlink signal which is the original signal.

The gain control unit 400 may control a gain of the output signal of the interference cancellation unit 300, that is, the digitalized input signal from which the interference signal is canceled. The gain control unit 400 may constantly maintain the gain of the output signal of the interference cancellation unit 300 to correspond to a predetermined level. Hereinafter, this will be described in more detail with reference to FIGS. 3 and 4.

The pre-distortion unit 500 may receive the output signal of the interference cancellation unit 300, of which the gain is controlled by the gain control unit 400. The pre-distortion unit 500 may distort and output the output signal of the interference cancellation unit 300, of which the gain is controlled by the gain control unit 400 based on the non-linear characteristic of a power amplifier (not illustrated) included in the transmission processing unit 700. For example, the pre-distortion unit 500 may receive the output signal of the power amplifier, measure the non-linear characteristic of the power amplifier from the output signal of the power amplifier, and distort and output the output signal of the interference cancellation unit 300, of which the gain is controlled so as to have non-linearity contrary to the measured non-linear characteristic of the power amplifier.

The digital/analog conversion unit 600 may receive the output signal of the interference cancellation unit 300, which is distorted by the pre-distortion unit 500. The digital/analog conversion unit 600 may convert the output signal of the interference cancellation unit 300 into the analog signal.

The transmission processing unit 700 may be configured to frequency-up-convert, amplify, and output the analog signal. For example, the transmission processing unit 700 may include a frequency up converter up-converting the analog signal into the signal in the radio frequency band, a power amplifier amplifying and outputting the signal frequency-up-converted by the frequency up converter, and a filter for selecting a band required in the amplified signal, and perform signal processing for transmitting the analog signal to the terminal MS (see FIG. 1) through the transmitting antenna TX by using the aforementioned components. Herein, the frequency up converter may be optionally omitted.

The transmission processing unit 700 may further include an isolator for protecting the power amplifier, and the like at the rear end of the power amplifier.

As described above, the interference cancellation relay device 10 includes the gain control unit 400 between the interference cancellation unit 300 and the pre-distortion unit 500 to constantly maintain the gain of the signal input into the pre-distortion unit 500, and thereby preventing distortion of a transmission signal while minimizing interference and oscillation of the signal by the interference cancellation unit 300, and as a result, the quality of the communication service may be enhanced.

Figure 3:
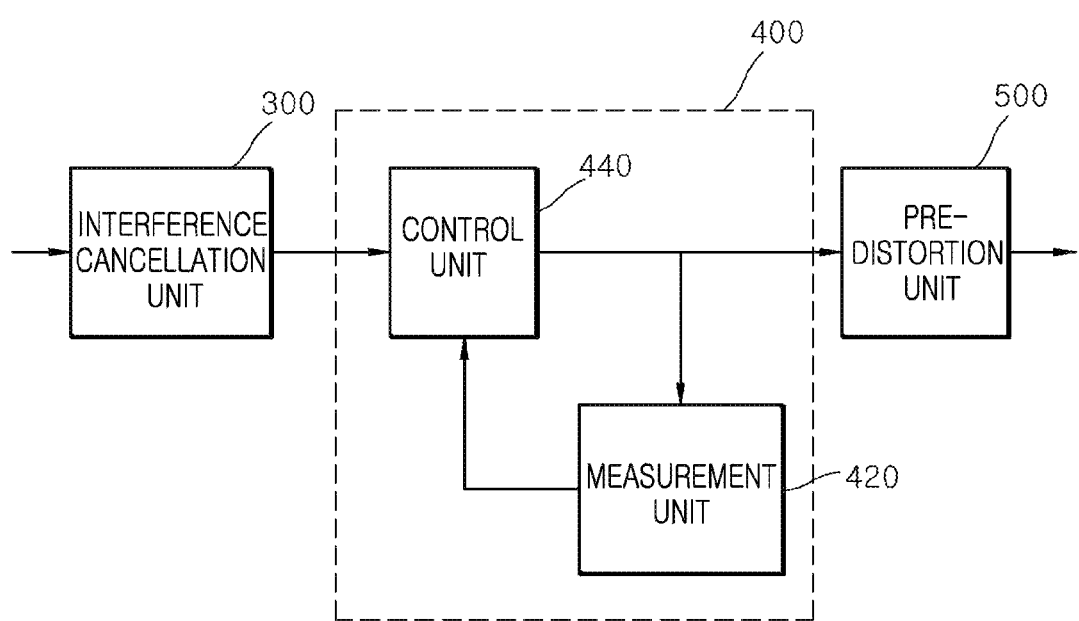
FIGS. 3 and 4 are diagrams for, in detail, describing some components of the interference cancellation relay device of FIG. 2.
Figure 4:
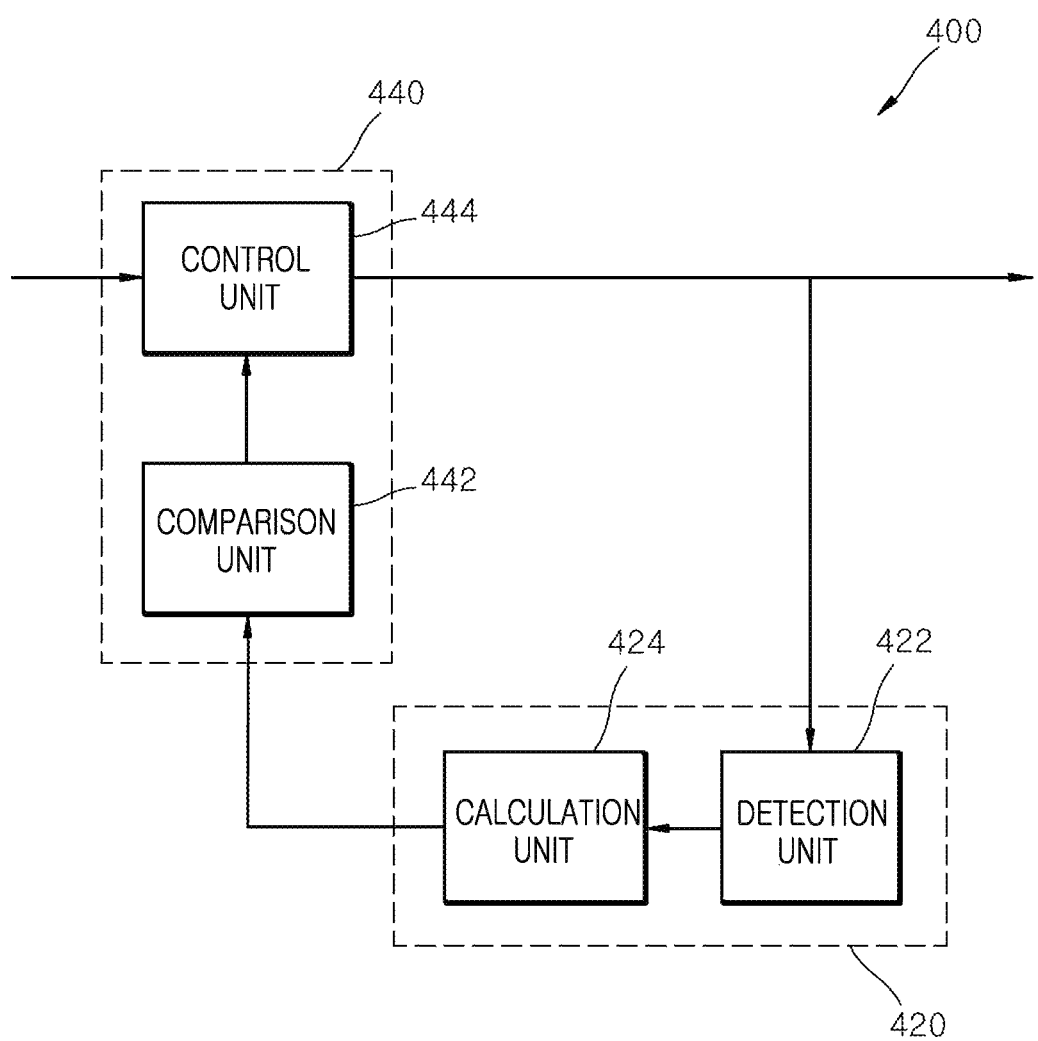

FIGS. 3 and 4 are diagrams for, in detail, describing some components of the interference cancellation relay device 10 of FIG. 2. FIG. 3 is a diagram illustrating, in more detail, a gain control unit 400 and FIG. 4 is a diagram illustrating one implementation example of a measurement unit 420 and a control unit 440 in the gain control unit 400.

Referring to FIGS. 3 and 4, the gain control unit 400 may include the measurement unit 420 and the control unit 440.

The measurement unit 420 may detect a reference signal from the output signal of the interference cancellation unit 300 that is the digitalized input signal, which is corresponded to the downlink signal equivalent to the original signal according as the interference signal is cancelled therefrom, and measure the intensity of the reference signal. The reference signal may be a signal having a predetermined intensity regardless of fluctuation of a data amount included in the downlink signal provided from the base station BTS (see FIG. 1) among input signals into the interference cancellation relay device 10. For example, when a mobile communication service provided by the interference cancellation relay device 10 is long term evolution (LTE), the reference signal may be a primary synchronization signal (PSS) or a secondary synchronization signal (SSS) which is a signal distinguished from a data signal and is a synchronization signal. Alternatively, when the mobile communication service provided by the interference cancellation relay device 10 is wideband code division multiple access (WCDMA)/CDMA, the reference signal may be a pilot signal which is a synchronization signal.

The measurement unit 420 may include a detection unit 422 detecting the reference signal from the output signal of the interference cancellation unit 300 and a calculation unit 424 calculating the intensity of the detected reference signal. For example, when the reference signal is the primary synchronization signal, the detection unit 422 may filter the primary synchronization signal which is present at a center frequency in the output signal of the interference cancellation unit 300 and the calculation unit 424 may be configured to calculate the intensity of the filtered primary synchronization signal.

The control unit 440 may control the gain of the output signal of the interference cancellation unit 300 by using the intensity of the reference signal measured by the measurement unit 420. For example, the control unit 440 compares the intensity of the reference signal with a predetermined reference intensity and control the gain of the output signal of the interference cancellation unit 300 according to a result of the comparison. The predetermined reference intensity may correspond to a level of the gain to allow the pre-distortion unit 500 to stably operate. The reference intensity may be provided from a processor (not illustrated) of the interference cancellation relay device 10 and updated adaptively to a change of the communication service, and the like.

The control unit 440 may include a comparison unit 442 comparing the intensity of the reference signal with the predetermined reference intensity and a control unit 444 controlling the gain of the output signal of the interference cancellation unit 300 according to a result of the comparison. For example, according to the comparison result by the comparison unit 442, when the intensity of the reference signal is larger than the reference intensity, the control unit 444 may decrease the gain of the output signal of the interference cancellation unit 300, when the intensity of the reference signal is smaller than the reference intensity, the control unit 444 may increase the gain of the output signal of the interference cancellation unit 300, and when intensity of the reference signal is the same as the reference intensity, the control unit 444 may be configured to maintain the gain of the output signal of the interference cancellation unit 300.

Figure 5:
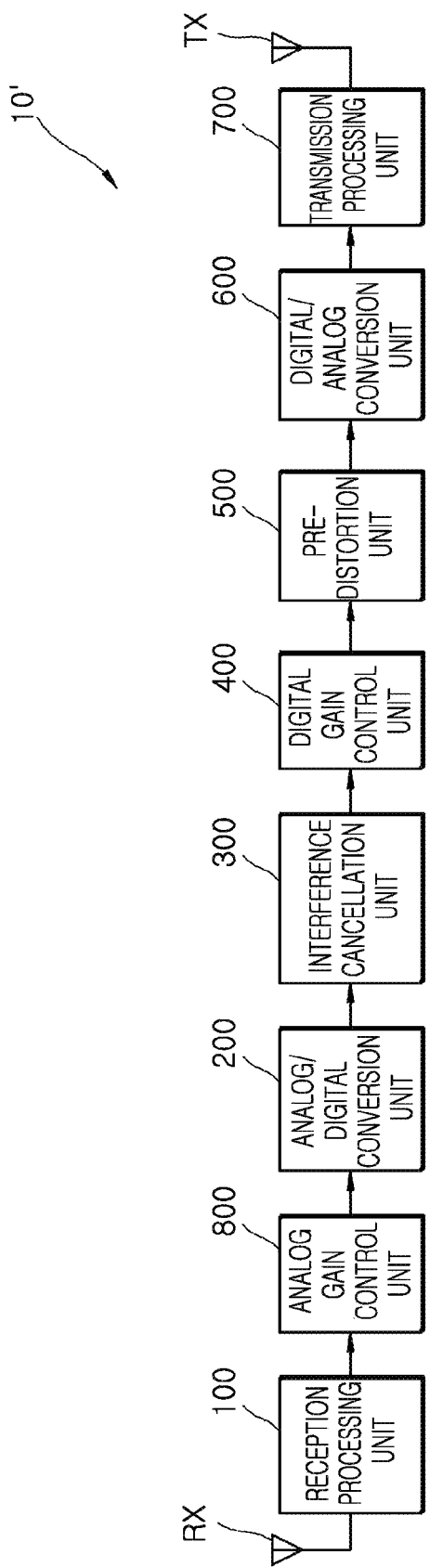
FIG. 5 is a block diagram schematically illustrating an interference cancellation relay device according to another embodiment of the inventive concept.

FIG. 5 is a block diagram schematically illustrating an interference cancellation relay device 10' according to another embodiment of the inventive concept. The interference cancellation relay device 10' illustrated in FIG. 5 as a modified example of the interference cancellation relay device 10 illustrated in FIG. 2 further includes an analog gain control unit 800 between the reception processing unit 100 and the analog/digital conversion unit 200 unlike the interference cancellation relay device 10 of FIG. 2. In describing FIG. 5, duplicated description with FIGS. 2 to 4 will be omitted and a different from FIGS. 2 to 4 will be primarily described.

Referring to FIG. 5, the interference cancellation relay device 10' may include the receiving antenna RX, the reception processing unit 100, the analog gain control unit 800, the analog/digital conversion unit 200, the interference cancellation unit 300, the gain control unit (hereinafter, referred to as a digital gain control unit for convenience of the explanation, 400), the pre-distortion unit 500, the digital/analog conversion unit 600, the transmission processing unit 700, and the receiving antenna TX.

The reception processing unit 100 may receive the input signal provided to the interference cancellation relay device 10 from the base station BTS (see FIG. 1) through the receiving antenna RX and may be configured to eliminate the noise from the input signal and down-convert the frequency of the input signal and output the input signal.

The analog gain control unit 800 may control the gain of the input signal signal-processed by the reception processing unit 100. The analog gain control unit 800 may constantly maintain the gain of the input signal signal-processed by the reception processing unit 100 to correspond to a predetermined level.

Meanwhile, it is illustrated that the analog gain control unit 800 is a component apart from the reception processing unit 100 for convenience of the explanation, but the inventive concept is not limited thereto. The analog gain control unit 800 may be included in the reception processing unit 100, of course.

The analog/digital conversion unit 200 may receive the input signal of which the gain is controlled by the analog gain control unit 800 and convert the received input signal into the digital signal.

The interference cancellation unit 300 may receive the input signal digitalized from the analog/digital conversion unit 200 and cancel the interference signal from the digitalized input signal and output the input signal from which the interference signal is cancelled.

The digital gain control unit 400 may control the gain of the output signal of the interference cancellation unit 300, that is, the digitalized input signal from which the interference signal is cancelled. The gain control unit 400 may constantly maintain the gain of the output signal of the interference cancellation unit 300 to correspond to a predetermined level.

The pre-distortion unit 500 may receive the output signal of the interference cancellation unit 300 of which the gain is controlled by the digital gain control unit 400 and distort and output the output signal of the interference cancellation unit 300 based on the non-linear characteristic of the power amplifier (not illustrated) included in the transmission processing unit 700.

The digital/analog conversion unit 600 may receive the output signal of the interference cancellation unit 300, which is distorted by the pre-distortion unit 500 and convert the output signal into the analog signal.

The transmission processing unit 700 may be configured to frequency-up-convert and amplify the analog signal and transmit the corresponding signal to the terminal MS (see FIG. 1) through the transmitting antenna TX.

As described above, the interference cancellation relay device 10' includes the digital gain control unit 400 between the interference cancellation unit 300 and the pre-distortion unit 500 to constantly maintain the gain of the signal input into the pre-distortion unit 500 and constantly maintain the gain of the signal input into the interference cancellation unit 300 after digitally converted, thereby preventing oscillation and distortion of transmission signals, and as a result, the quality of the communication service may be improved.

Figure 6:
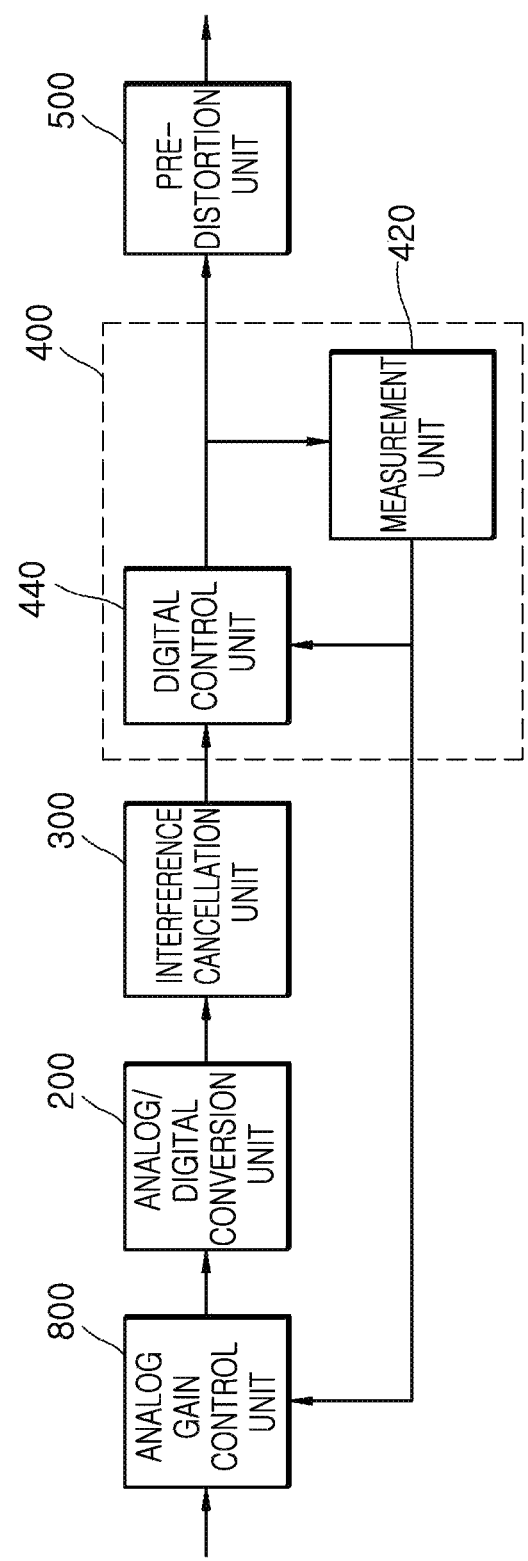
FIGS. 6 and 7 are diagrams for, in detail, describing some components of the interference cancellation relay device of FIG. 5.
Figure 7:
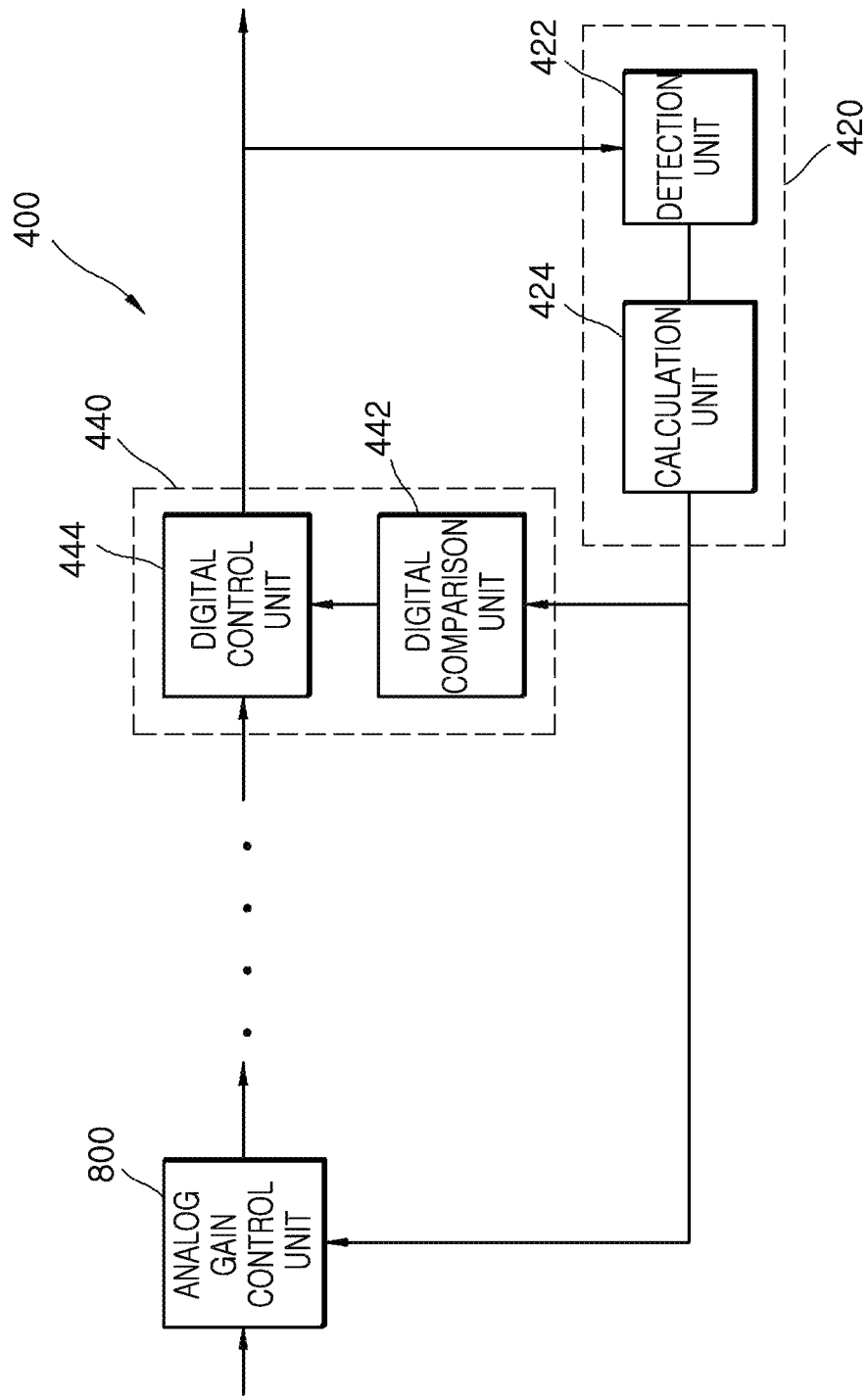

FIGS. 6 and 7 are diagrams for, in detail, describing some components of the interference cancellation relay device 10' of FIG. 5. FIG. 6 is a diagram illustrating, in more detail, a digital gain control unit 400 and an analog gain control unit 800 and FIG. 7 is a diagram illustrating one implementation example of a connection between a measurement unit 420 and a digital control unit 440 and between an analog gain control unit 800 and a measurement unit 420 in the digital gain control unit 400. In describing FIGS. 6 and 7, duplicated description with FIGS. 2 to 4 will be omitted and a different from FIGS. 2 to 4 will be primarily described.

Referring to FIGS. 6 and 7, the digital control unit 440 of the digital gain control unit 400 may constantly maintain the gain of the output signal of the interference cancellation unit 300 by using the intensity of the reference signal, which is measured by the measurement unit 420, for example, an intensity of a signal having a predetermined intensity regardless of fluctuation of the data mount included in the downlink signal provided from the base station BTS (see FIG. 1) among input signals into the interference cancellation relay device 10'.

The analog gain control unit 800 may constantly maintain the gain of the input signal digitalized through the analog/digital conversion unit 200 and input into the interference cancellation unit 300 by using the intensity of the reference signal, which is measured by the measurement unit 420 of the digital gain control unit 400. In some embodiments, the analog gain control unit 800 may be configured similarly to the digital control unit 440 of the digital gain control unit 400.

Hereinabove, the inventive concept has been described in detail with reference to a preferred embodiment, but the inventive concept is not limited to the embodiment and various modifications and changes can be made by those skilled in the art within the technical spirit and scope of the inventive concept.

The invention claimed is:

1. An interference cancellation relay device, comprising:
   an interference cancellation unit cancelling an interference signal from an input signal and outputting the input signal from which the interference signal is cancelled;
   a gain control unit controlling a gain of an output signal of the interference cancellation unit; and
   a pre-distortion unit distorting the output signal of the interference cancellation unit, of which the gain is controlled by the gain control unit,
   wherein the gain control unit includes:
      a measurement unit extracting a reference signal from the output signal of the interference cancellation unit and measuring an intensity of the extracted reference signal, wherein the reference signal is predefined as control data to control receipt of user data and is distinct from the user data; and
      a control unit controlling the gain of the output signal of the interference cancellation unit by using the intensity of the reference signal, and
   wherein the control unit includes:
      a comparison unit comparing the intensity of the reference signal with a predetermined reference intensity; and
      an adjustment unit adjusting the gain of the output signal of the interference cancellation unit based on a result of the comparing.

2. The interference cancellation relay device of claim 1, wherein the reference signal is a signal having a predetermined intensity regardless of fluctuation of a data amount included in the input signal.

3. The interference cancellation relay device of claim 1, wherein the measurement unit includes:
   an extraction unit extracting the reference signal from the output signal of the interference cancellation unit; and
   a calculation unit calculating the intensity of the reference signal.

4. An interference cancellation relay device, comprising:
   a first gain control unit controlling a gain of an input signal;
   a conversion unit digitalizing the input signal of which the gain is controlled by the first gain control unit;
   an interference cancellation unit cancelling an interference signal from the digitalized input signal and outputting the input signal from which the interference signal is cancelled;
   a second gain control unit controlling the gain of the output signal of the interference cancellation unit; and
   a pre-distortion unit distorting the output signal of the interference cancellation unit, of which the gain is controlled by the second gain control unit,
   wherein the second gain control unit includes:
      a measurement unit extracting a reference signal from the output signal of the interference cancellation unit and measuring an intensity of the extracted reference signal, wherein the reference signal is predefined as control data to control reception of user data and is distinct from the user data; and
      a control unit controlling the gain of the output signal of the interference cancellation unit by using the intensity of the reference signal, and wherein the first gain control unit controls the gain of the input signal by using the intensity of the reference signal, which is measured by the measurement unit.

5. The interference cancellation relay device of claim 4, wherein the reference signal is a signal having a predetermined intensity regardless of fluctuation of a data amount included in the input signal.

\* \* \* \* \*